(12) United States Patent
Jeng et al.

(10) Patent No.: US 7,732,892 B2
(45) Date of Patent: Jun. 8, 2010

(54) FUSE STRUCTURES AND INTEGRATED CIRCUIT DEVICES

(75) Inventors: Shin-Puu Jeng, Hsinchu (TW); Anbiarshy Wu, Chiayi (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/592,216

(22) Filed: Nov. 3, 2006

(65) Prior Publication Data

US 2008/0105948 A1 May 8, 2008

(51) Int. Cl.
*H01L 29/00* (2006.01)
(52) U.S. Cl. .................. 257/529; 257/209; 257/499; 257/E23.149
(58) Field of Classification Search ............... 257/499, 257/E23.149, 529, 209
See application file for complete search history.

(56) References Cited

U.S. PATENT DOCUMENTS

| 6,667,537 | B1 * | 12/2003 | Koike et al. ............... 257/536 |
| 6,693,481 | B1 | 2/2004 | Zheng |
| 7,009,222 | B2 | 3/2006 | Yang et al. |
| 2002/0005563 | A1 * | 1/2002 | Shu ............... 257/529 |
| 2003/0160298 | A1 * | 8/2003 | Nakamura ............... 257/530 |
| 2005/0285224 | A1 * | 12/2005 | Tsutsui ............... 257/531 |
| 2006/0289898 | A1 * | 12/2006 | Kono et al. ............... 257/529 |
| 2007/0052063 | A1 * | 3/2007 | Ueda ............... 257/529 |
| 2007/0145515 | A1 * | 6/2007 | Chen et al. ............... 257/499 |

FOREIGN PATENT DOCUMENTS

| CN | 1430273 A | 7/2003 |
| CN | 1581479 A | 2/2005 |
| CN | 1716591 A | 1/2006 |

* cited by examiner

*Primary Examiner*—Cuong Q Nguyen
*Assistant Examiner*—Trang Q Tran
(74) *Attorney, Agent, or Firm*—Birch, Stewart, Kolasch & Birch, LLP

(57) ABSTRACT

Fuse structures and integrated circuit devices are disclosed. An exemplary embodiment of a fuse structure comprises a first and second metal pads formed at different positions in a first dielectric layer and a conductive line formed in a second dielectric layer underlying the first dielectric layer, electrically connecting the first and second pad. The conductive line is formed with at least one first portion at an end thereof and a second portion connected with the first portion, wherein the width of the first portion is greater than the width of the second portion.

4 Claims, 7 Drawing Sheets

FUSE STRUCTURES AND INTEGRATED CIRCUIT DEVICES

BACKGROUND

The invention relates to semiconductor devices, and more particularly to fuse structures and integrated circuit devices comprising the same.

Fuses are frequently used to reconfigure memory and logic circuitry. For example, in dynamic or static memory chips, defective memory cells or circuitry may be replaced by blowing fuses associated with the defective circuitry while activating redundant circuitry to form new memory circuits. This circuit rerouting using blowable fuse links contributes to enhanced yields without the necessity of scrapping defective process wafers.

Generally, fuse links, made of a conductive material, such as a metal may be blown or removed by passing an excessive current through the circuitry which melts the fuse link, or exposing the fuse link to intense laser irradiation to ablate the fuse link including a window of a thin transparent layer of oxide insulating material above the fuse link.

One problem with a metal fuse link is the relatively large size thereof, which is difficult to reduce. The metal fuse link is blown by an external energy source, such as a laser beam, to thereby limit their formations near a top portion of an integrated circuit chip.

Thus, another type of fuse link referred to as poly fuse ("polysilicon" or "poly resistor" fuse) has recently been introduced. One advantage of the poly fuse link over the metal fuse link is the lower amount of current required to open the fuse element during programming and is allowed to be disposed in an internal part of an integrated circuit chip. Typical poly fuses in a fuse array exhibit a pre-burned resistance of 30-100 ohms and incorporate metal silicide such as nickel (Ni) silicide. In order to burn (or blow) the poly fuses in a fuse cell effectively, a relatively high fuse programming voltage is required. Currently, however, the highest fuse programming voltage applied to poly fuses in a fuse array is typically limited to the common chip core burn-in voltage (Vcc) to ensure reliability. Unfortunately, the common chip core burn-in voltage (Vcc) is sometimes not sufficient to effectively program the fuses in the fuse array. In addition, the metal silicide used in the poly fuse may cause current leakage after blow up thereof. As a result, the fuse programming failure rate in a fuse array is high and, likewise, current leakage may occur near a place where the poly fuse blew up.

SUMMARY

Therefore, a need exists for a new IC device fuse structure to solve the drawbacks. Fuse structures and integrated circuit devices using the same are thus provided.

An exemplary embodiment of an integrated circuit (IC) device comprises first and second metal pads formed at different positions in a first dielectric layer and a conductive line formed in a second dielectric layer underlying the first dielectric layer, electrically connecting the first and second metal pads. The conductive line is formed with at least one first portion at an end thereof and a second portion connected with the first portion, wherein the width of the first portion is greater than the width of the second portion.

Another exemplary embodiment of a fuse structure comprises a first and second metal pads formed at different positions in a first dielectric layer, defining an inter-area therebetween and a conductive line formed in a second dielectric layer underlying the first dielectric layer, electrically connecting the first and second metal pads. The conductive line extends in the second dielectric layer underlying the inter-area and makes at least two U-turns.

Another exemplary embodiment of an integrated circuit (IC) device comprises a semiconductor substrate with a conductive line formed in a first dielectric layer underlying the semiconductor substrate. A first and second metal pads are formed at different positions in a second dielectric layer overlying the first dielectric layer, defining an inter-area therebetween. The conductive line electrically connects the metal pads and the conductive line extends in the first dielectric layer underlying the inter-area and makes at least two U-turns.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
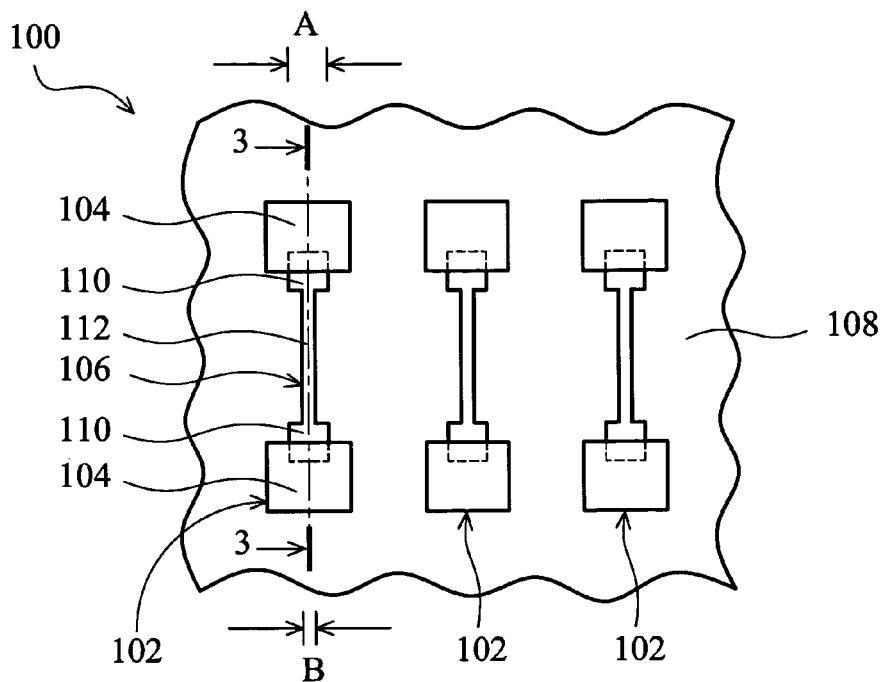
FIG. 1 is a schematic top view of an integrated circuit device of an embodiment of the invention.

FIG. 1 is a schematic diagram showing a top view of a portion of an exemplary integrated circuit (IC) device 100 comprising a plurality of fuse structures 102 thereon. Each of the fuse structures 102 includes a pair of metal pads 104 and a conductive line 106 formed therebetween, both overlying a semiconductor structure 108. The conductive line 106 comprises a pair of first portions 110 and a second portion 112 therebetween. The first portions 110 and the second portion 112 of the conductive line 106 are formed with different line widths, wherein the first portions 110 of the conductive line 106 are now formed with a width A of about 10~300%, preferably of about 20~100%, greater than the width B of the second portion 112 of the conductive line 106. In addition, each of the metal pads 104 partially covers and physically contacts a portion of the first portion 110 of the conductive line 106. The metal pads 104 and the conductive line 106 can comprise the same or different metals, such as Al, Cu, W, or alloys thereof. As shown in FIG. 1, the top view of conductive line 106 is substantially I-shaped.

Figure 2:
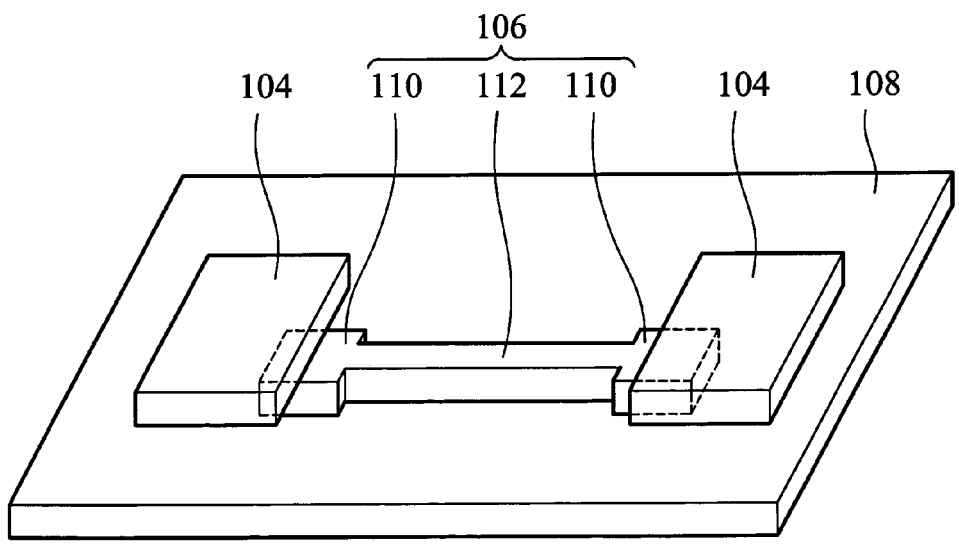
FIG. 2 is a schematic stereo-view showing a fuse structure of the IC device of FIG. 1.

FIG. 2 schematically shows a stereo diagram of one of the fuse structures 102 illustrated in FIG. 1. The pair of metal pads 104 formed at opposing sides of the semiconductor structure 108. The conductive line 106 is formed over the semiconductor structure 108 and between the pair of pads 104. The conductive line 106 also underlies a portion of the pair of pads 104, respectively. The first portions 110 of the conductive line 106 are now partially covered by one of the pads 104, respectively forming electrical contacts therebetween.

The following formulas are definition of resistance R (see formula 1) and joule heating (formula 2) of a conductive member.

$$R = \rho L / A \quad (1);$$

wherein R represents resistance (ohms) of the conductive member, $\rho$ represents resistivity (ohms-$\mu$m) of the material of the conductive member, L represents a length ($\mu$m) of the conductive member and A represents a cross-sectional area ($\mu m^2$) of the conductive member.

$$P_{joule} = I^2 R \quad (2);$$

wherein $P_{joule}$ represents power (W) of the conductive member, I represents a current (A) passes through the conductive member and R represents a resistance (ohms) of the material of the conductive member which can be obtained from the formula 1.

Taking the conductive line 106 illustrated in FIGS. 1-2 as an example of a conductive member, according to above definitions of resistance R (referring to formula 1) and joule heating (referring to formula 2), once a cross-sectional area of the conductive line 106 is reduced, resistance and joule heating performance thereof increase. Therefore, as shown in FIGS. 1 and 2, since a cross-sectional area of the conductive line 106 is reduced at a junction between the first portions 110 and the second portion 112, resistance at these junctions significantly increases causing current crowding. Thus, when large current is applied on one of the pad 104 and passes through the conductive line 106, joule heating at the junction between the first and second portions of the conductive line 106 may significantly increase, blowing up the conductive line 106.

Figure 3:
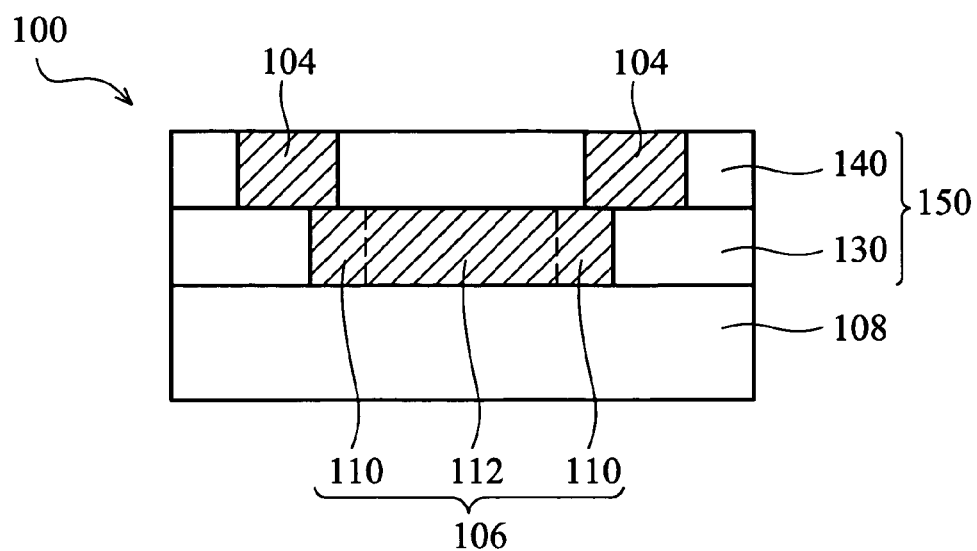
FIG. 3 is a schematic cross section taken along line 3-3 of FIG. 1, illustrating an embodiment of a fuse structure.
Figure 4:
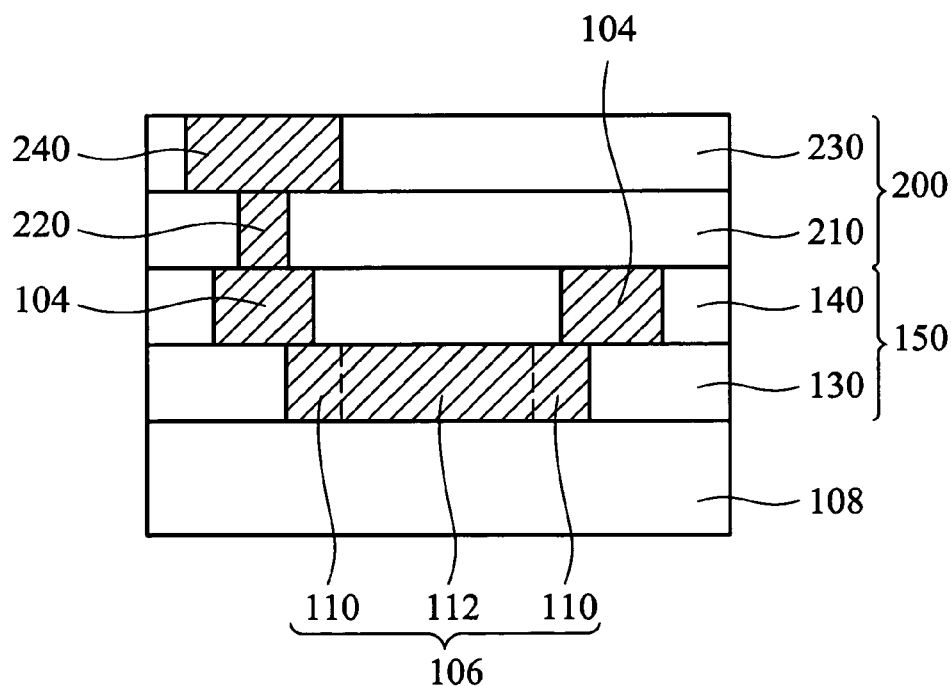
FIG. 4 is a schematic cross section illustrating another embodiment of an fuse structure.
Figure 5:
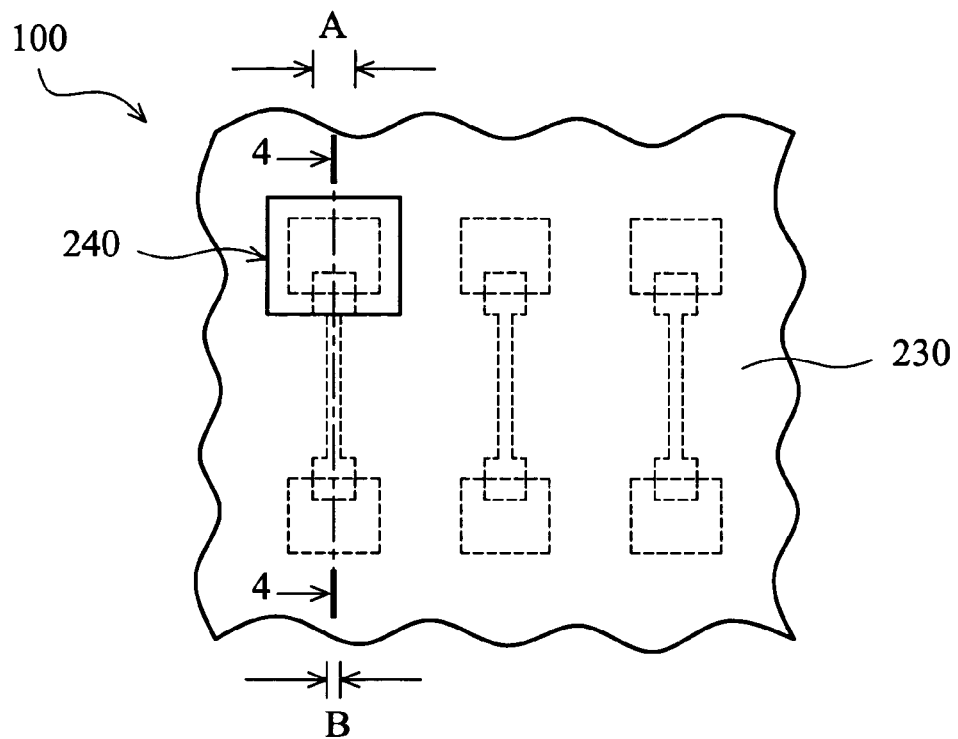
FIG. 5 is a schematic top view of an integrated circuit device comprising the fuse structure illustrated in FIG. 4.

FIG. 3 illustrates a cross section of the fuse structure 106 along a line 3-3 in FIG. 1. Herein, the conductive line 106 comprising the first portions 110 and the second portion 112 is embedded in a dielectric layer 130 overlying the semiconductor structure 108. The semiconductor structure 108 herein is illustrated as a planar substrate and may comprise a semiconductor substrate and active or passive devices formed thereon/therein, neither is illustrated here, for clarity. The metal pads 104 are embedded in a dielectric layer 140 overlying the dielectric layer 130 and the conductive line 106, thereby functioning as a portion of an interconnect structure 150 of the IC device 100. Another structure such as another interconnect structure or a bond pad structure can be sequentially fabricated and is formed over the interconnect structure 150, such as the structure 200 illustrated in FIG. 4. As shown in FIG. 4, the structure 200 includes a dielectric layer 210 with a conductive contact 220 formed therein, overlying the interconnect structure 150, and another dielectric layer 230 with a conductive pad 240, overlying the dielectric layer 210 and the conductive contact 220. The conductive pad 240 can be an uppermost pad for applying a fuse blow-up process and is electrically connected to the fuse structure through the conductive contact 220. FIG. 5 illustrates a schematic top view of the modified embodiment illustrated in FIG. 4, wherein the cross-sectional view of FIG. 4 is a cross-sectional view taken along line 4-4 in FIG. 5.

Figure 6:
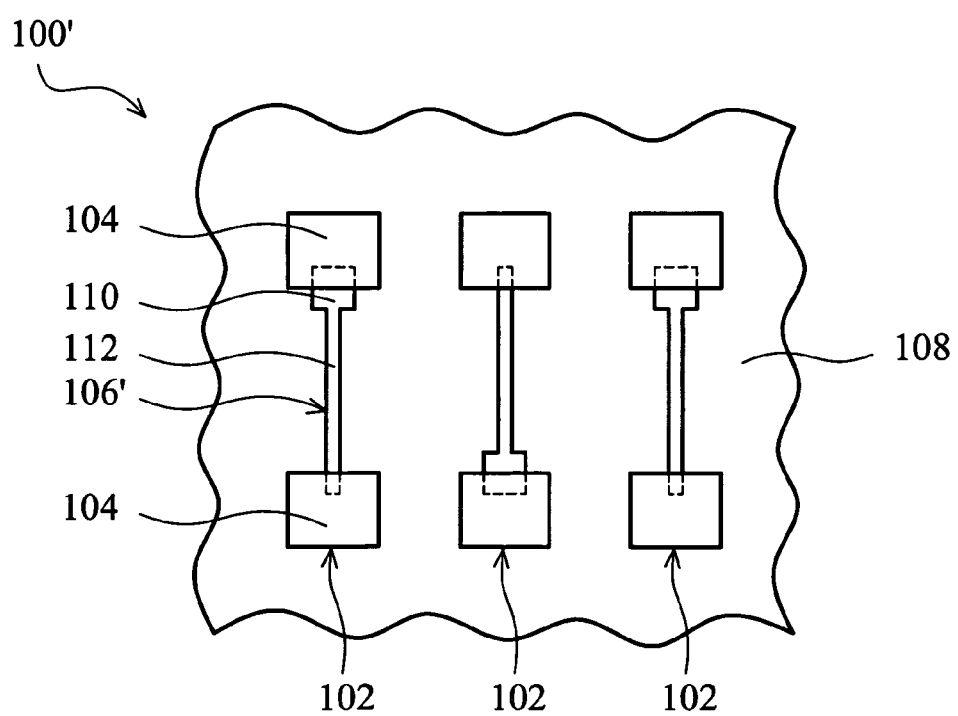
FIG. 6 is a schematic top view of an integrated circuit device of yet another embodiment of the invention.

Moreover, FIG. 6 illustrates an exemplary embodiment of a modified IC structure 100' similar to that illustrated in FIG. 1. As shown In FIG. 6, each of the pair of metal pads 104 are now connected by a conductive line 106'. The conductive line 106' now includes only one first portion 110 partially covered by one of the metal pads 104 and a second portion 112 partially covered by another metal pad 104 of the fuse structure 102. The metal pad 104 partially covering the first portion of the conductive line 106' functions as a pad for receiving a current during a fuse blow up process. As shown in FIG. 6, the conductive line 106' is substantially T-shaped or reversed T-shaped from the top view.

Figure 7:
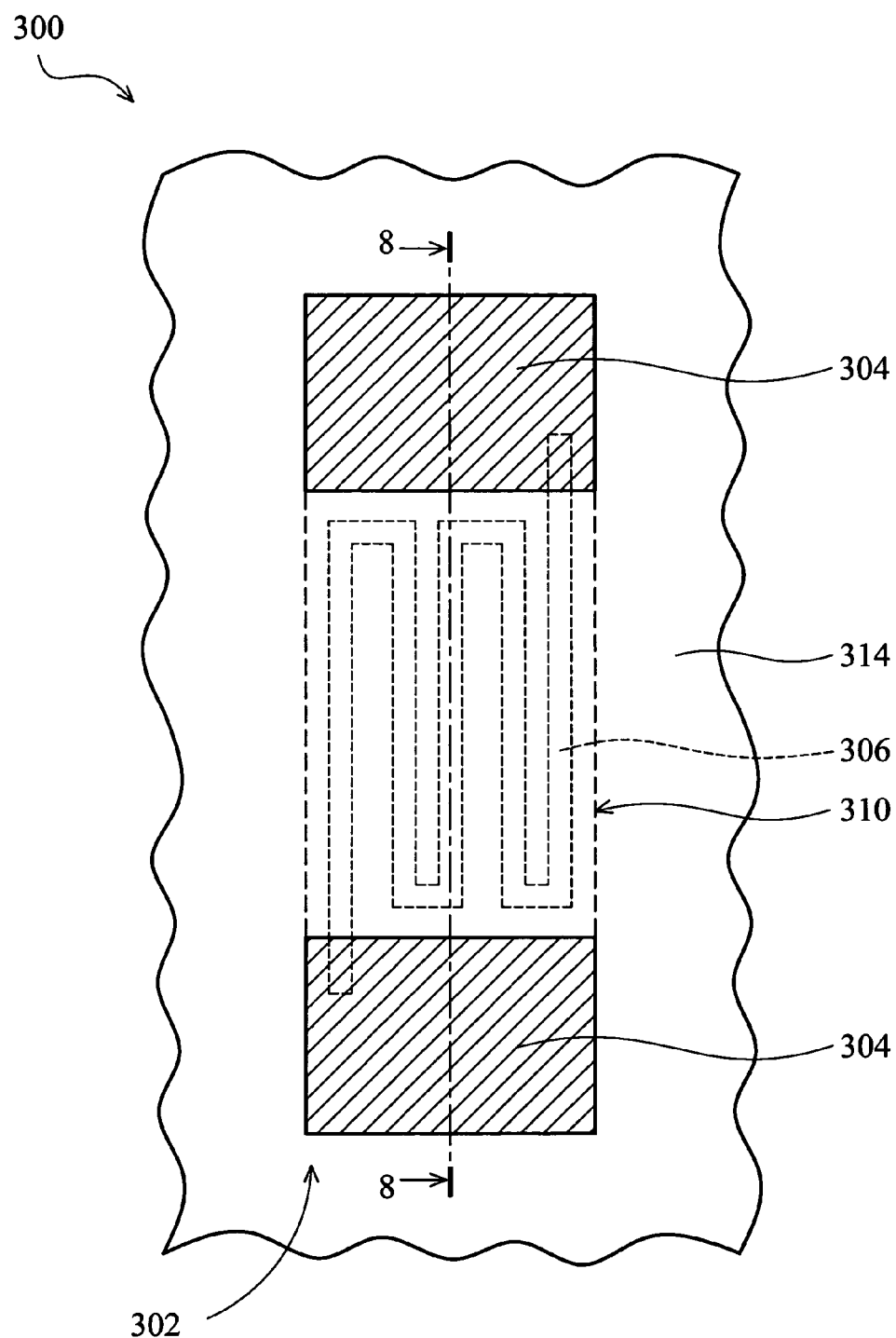
FIG. 7 is a schematic top view of an integrated circuit device of another embodiment of the invention.

FIG. 7 is a schematic diagram showing a top view of a portion of another exemplary integrated circuit (IC) device 300 comprising a fuse structure 302 thereon. The fuse structures 302 include a pair of metal pads 304 and a conductive line 306 formed therebetween, both overlying a semiconductor structure 308 (shown in FIG. 8). The conductive line 306 is now formed as a conductive line extending across in an area 310 (shown as dotted lines) defined between the metal pads 304. The conductive line 306 now occupies about 10~90% (volume %) of the area 310 and each of the metal pads 304 partially covers a portion and physically contacts the conductive line 306. The metal pads 304 and the conductive line 306 can comprise the same or different materials, such as Al, Cu, W, or alloys thereof.

Figure 8:
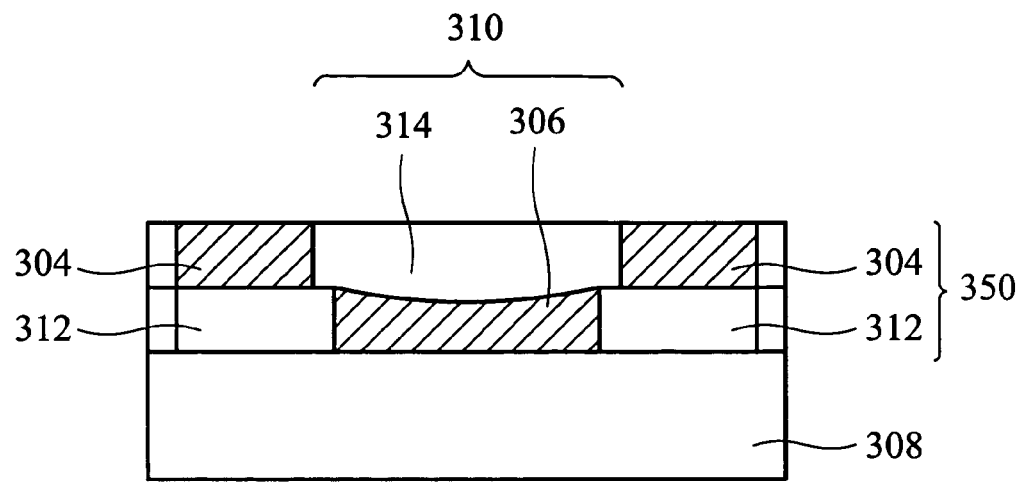
FIG. 8 is a schematic cross section taken along line 8-8 of FIG. 7, illustrating another embodiment of a fuse structure.
Figure 9:
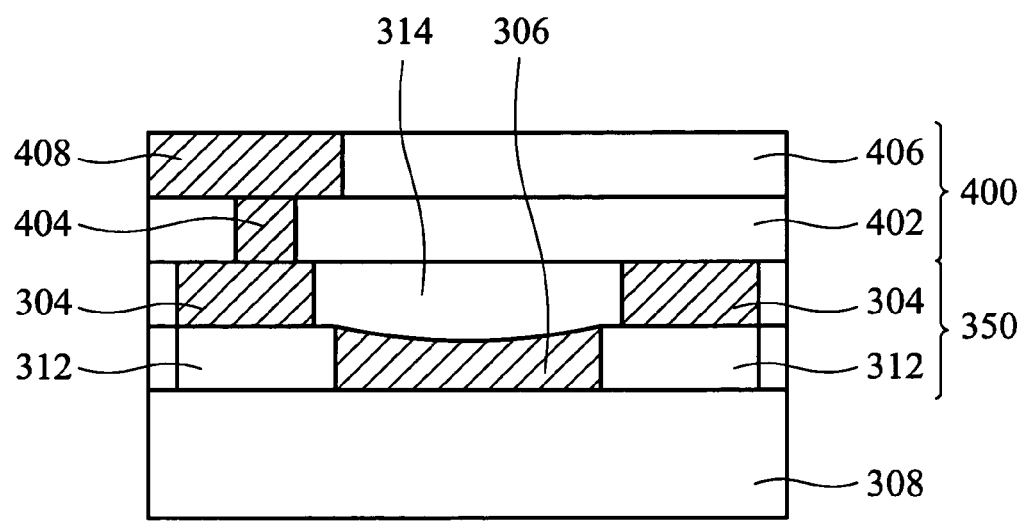
FIG. 9 is a schematic cross illustrating another embodiment of a fuse structure.
Figure 10:
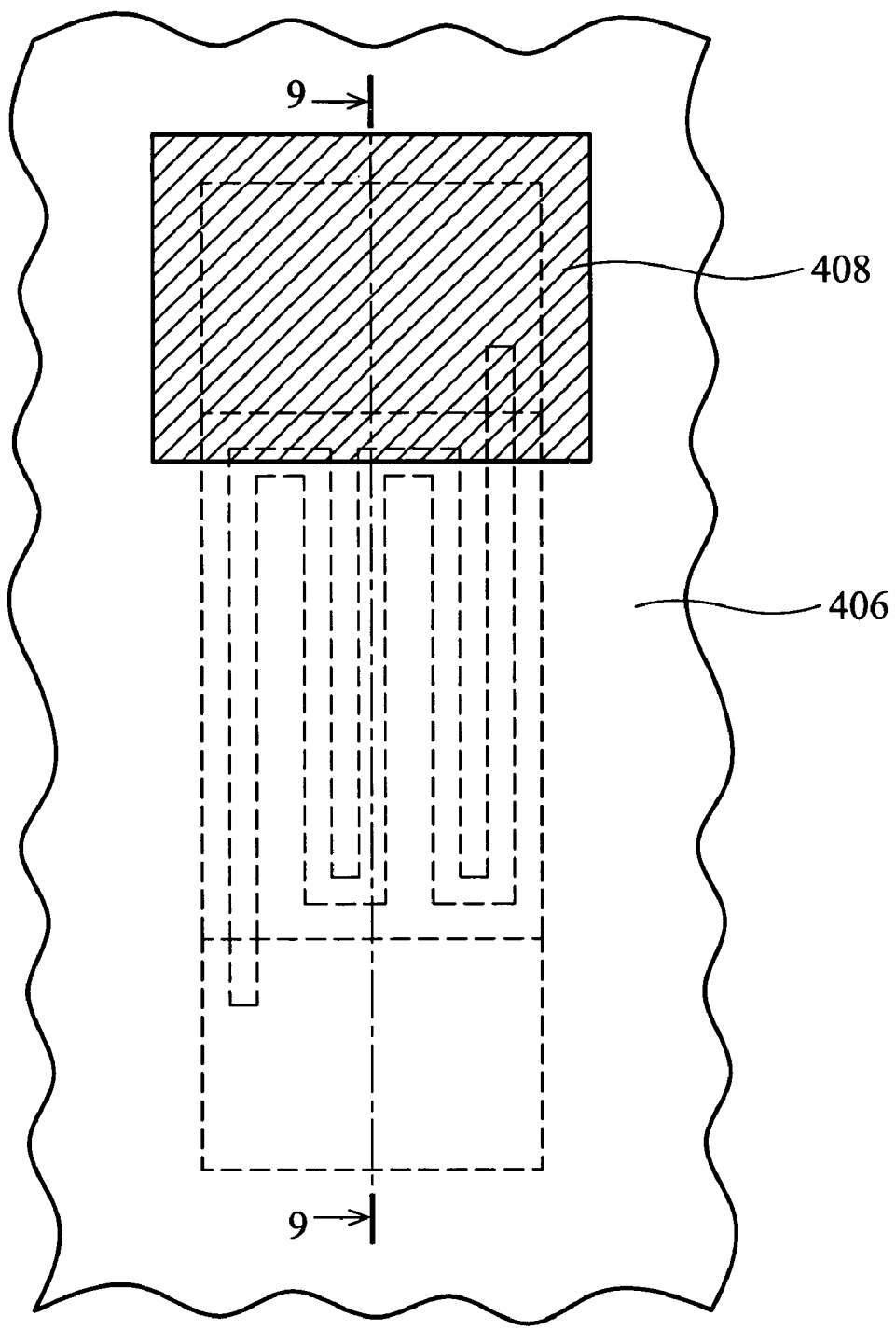
FIG. 10 is a schematic top view of an integrated circuit device comprising the fuse structure illustrated in FIG. 9.

FIG. 8 illustrates a cross section of the fuse structure 302 along a line 8-8 in FIG. 7. Herein, the conductive line 306 extending in the area 310 is now embedded in a dielectric layer 312 formed over the semiconductor structure 308. The metal pads 304 are now formed in a dielectric layer 314, overlying the dielectric layer 312 and the conductive line 306. The semiconductor structure 308 herein is illustrated as a planar structure and may comprise a semiconductor substrate and active or passive devices formed thereon/therein, neither is illustrated here for clarity. The metal pads 304 are embedded in a dielectric layer 314 overlying the dielectric layer 312 and the conductive line 306, thereby functioning as a portion of an interconnect structure 350 of the IC device 300. Other structures such as an interconnect structure or a bond pad structure can be further fabricated and formed over the interconnect structure 350, such as the structure 400 illustrated in FIG. 9. As shown in FIG. 9, the structure 400 includes a dielectric layer 402 with a conductive contact 404 formed therein, overlying the interconnect structure 350, and another dielectric layer 406 with a conductive pad 408, overlying the dielectric layer 402 and the conductive contact 404. The conductive pad 408 can be an uppermost pad for blowing up fuses electrically connected to the fuse structure by the conductive contact 404. FIG. 10 illustrates a schematic top view of the modified embodiment as illustrated in FIG. 9, wherein the cross-sectional view of FIG. 9 is taken along the line 9-9 in FIG. 10.

According to the formulas of resistance R (see formula 1) and joule heating (formula 2), once the length of a line is increased, resistance and joule heating thereof increase. Therefore, as shown in FIGS. 7 and 8, because a length of conductive line 306 is significantly extended across the area 310 between the pads 304, resistance of the line 306 is significantly increased. In addition, because the conductive line 306 now occupies about 25~60% (volume %) of the area 310 between the metal pads 304, metal density therein significantly increases and power dissipation therein is also increased. Thus, once a large current is applied to one of the metal pads 304 and passes through the conductive line 306, joule heating at turns of the conductive line 306 may significantly increase and the conductive line 306 of the fuse structure 310 can be easily opened. Moreover, since the conductive line 306 occupies a relatively high volume in the dielectric layer between the metal pads 304, dishing inevitably occurs, as shown in FIGS. 8 and 9.

Figure 11:
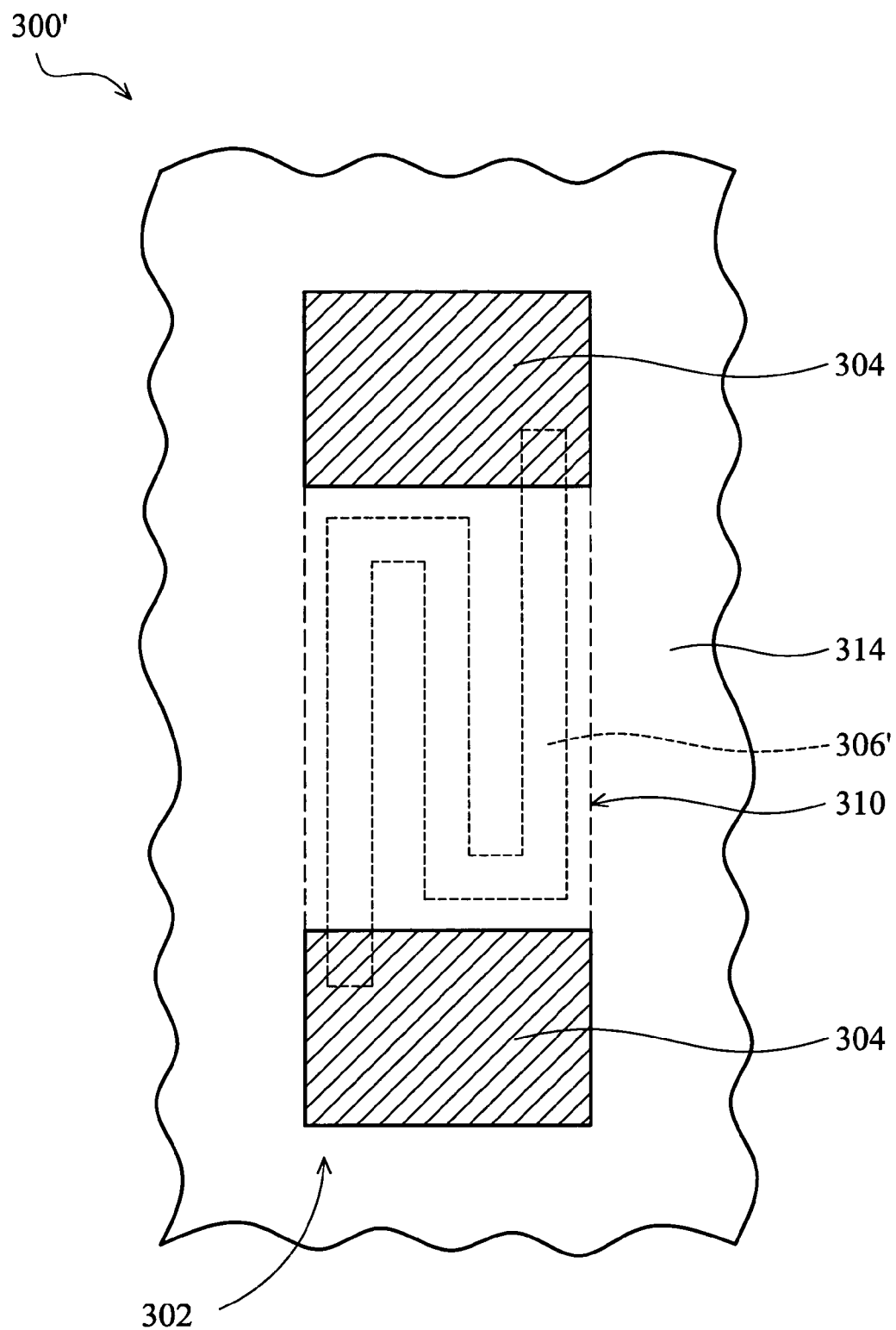
FIG. 11 is a schematic top view of an integrated circuit device of yet another embodiment of the invention.

FIG. 11 illustrates yet another exemplary embodiment of a modified IC structure 300' similar to that illustrated in FIG. 7. As shown In FIG. 11, each of the pair of metal pads 304 are now connected by a conductive line 306'. The conductive line 306' is now formed with a width greater than the conductive line 306 illustrated in FIGS. 7 and 10 but still occupies a volume about 25~60% of the area 310. As shown in FIG. 11, the conductive line is made of fewer U-turns and at least two turns are required for electrically connecting the opposing pads 304.

Through illustration of the above exemplary embodiments, the fuse structures provided can be even positioned in an inter-portion or an upper portion of an IC device and can be easily integrated in an interconnect fabrication process or a BEOL (back end of the line) fabrication process. The fuse structures can be fabricated by a conventional line fabrication or damascene process, thus, no additional fabrication processes are required. Moreover, the above structures also allow size reduction thereof with the trend of size reduction of the elements formed over the IC device.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC) device, comprising:

a first and second metal pads formed at different positions in a first dielectric layer, wherein the first and second metal pads are metal layers of a planar bottom surface;

a conductive line formed in a second dielectric layer underlying the first dielectric layer, wherein a top surface of the conductive line is entirely exposed by the second dielectric layer and the top surface of the conductive line is physically connecting the planar bottom surface of the first and second metal pads, and the conductive line is formed with a first portion at an end thereof and a second portion connected with the first portion, and the width of the first portion is greater than the width of the second portion, and the planar bottom surface of the first metal pad partially covers the first portion of the conductive line and is in physical contact with the top surface of the conductive line, and the planar bottom surface of the second metal pad partially covers the second portion of the conductive line and is in physical contact with the top surface of the conductive line;

a third dielectric layer formed over the first dielectric layer, comprising a conductive contact formed therein, wherein the conductive contact physically contacts the first metal pad partially covering the first portion of the conductive line; and a conductive pad formed over the third dielectric layer, physically contacting the conductive contact formed in the third dielectric layer, wherein the conductive pad functions as an uppermost pad for applying a fuse blow-up process.

2. The integrated circuit (IC) device as claimed in claim 1, wherein the width of the first portion is about 10~300% greater than that of the second portion.

3. The integrated circuit (IC) device as claimed in claim 1, wherein the top view of the conductive line is substantially T-shaped or reversed T-shape.

4. The integrated circuit (IC) device as claimed in claim 1, wherein the first metal pad contacting the first portion of the conductive line receives a current during the fuse blow-up process.

* * * * *